(12) United States Patent
Yow et al.

(10) Patent No.: US 8,836,091 B1
(45) Date of Patent: Sep. 16, 2014

(54) LEAD FRAME FOR SEMICONDUCTOR PACKAGE WITH ENHANCED STRESS RELIEF

(71) Applicants: Kai Yun Yow, Petaling Jaya (MY); Alexander M. Arayata, Gilbert, AZ (US); Jian Wen, Chandler, AZ (US)

(72) Inventors: Kai Yun Yow, Petaling Jaya (MY); Alexander M. Arayata, Gilbert, AZ (US); Jian Wen, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/794,841

(22) Filed: Mar. 12, 2013

(51) Int. Cl.
*H01L 23/495* (2006.01)

(52) U.S. Cl.
CPC .... *H01L 23/49568* (2013.01); *H01L 23/49565* (2013.01)
USPC ............ 257/667; 257/666; 257/670; 257/676

(58) Field of Classification Search
CPC ..................... H01L 23/4951; H01L 23/49517; H01L 23/49575; H01L 23/49513
USPC ................................. 257/666, 670, 676, 667
See application file for complete search history.

(56) References Cited

U.S. PATENT DOCUMENTS

| | | | |
|---|---|---|---|
| 4,595,945 A | 6/1986 | Graver | |
| 5,907,769 A | 5/1999 | Corisis | |
| 6,232,653 B1 * | 5/2001 | Tanaka et al. | 257/669 |
| 8,053,883 B2 | 11/2011 | Galera | |
| 2001/0045631 A1* | 11/2001 | Kinsman | 257/676 |
| 2007/0028685 A1* | 2/2007 | Shirasaka et al. | 73/493 |

* cited by examiner

*Primary Examiner* — Peniel M Gumedzoe
(74) *Attorney, Agent, or Firm* — Charles Bergere

(57) ABSTRACT

A semiconductor package includes a lead frame, a semiconductor die, bond wires providing an electrical connection between the die and the lead frame, and a mold compound that encapsulates the lead frame, the die and the bond wires. The lead frame includes spaced apart first and second frame members each having an inner peripheral edge and an opposing outer peripheral edge, spaced apart lead pads disposed between the inner peripheral edges of the first and second frame members, and conductive leads disposed proximate to the outer peripheral edge of each of the first and second frame members. The die is mounted on the lead pads.

18 Claims, 6 Drawing Sheets

LEAD FRAME FOR SEMICONDUCTOR PACKAGE WITH ENHANCED STRESS RELIEF

BACKGROUND OF THE INVENTION

The present invention is directed to semiconductor packaging and, more particularly, to a semiconductor package with low tensile and thermal stresses.

One popular type of semiconductor package is a quad flat no-lead (QFN) package. A typical QFN package includes a lead frame formed by an array of external conductive leads and a die attach pad or flag. An integrated circuit (IC) or semiconductor die is attached to the die flag and electrically connected to the external conductive leads with bond wires. To secure the die to the die flag, an adhesive material typically is dispensed onto the exposed surface of the die flag, the die is then placed thereon, and the adhesive material is cured through exposure and/or heating for a specified time period. All of the components are then encapsulated by a mold compound to form the final QFN semiconductor package, which has a generally rigid structure.

The die flag of conventional QFN packages typically has a generally square or rectangular shape, and its entire surface is coated with the adhesive material in order to bond the entire inactive surface of the die to the flag. As such, in conventional QFN packages, the surface area of the bonding interface between the die, adhesive material and the die flag is relatively large.

However, due to the large surface area of the bonding interface and the rigid nature of the lead frame (particularly the die flag), a high bond or tensile stress is imposed on the die during the bonding process. This tensile stress, in turn, can result in cracking of the die during the bonding process.

Also, because of the large surface area of the bonding interface and the difference in the coefficients of thermal expansion (CTE) of the interface materials (i.e., the die, the adhesive material and the die flag), residual thermal stresses are developed at the bonding interface. Such thermal stresses can warp the semiconductor package, thus negatively affecting the temperature coefficient of offset ($T_{co}$) (i.e., the measure of non-pressure induced stresses, as a function of temperature, placed on the semiconductor package) and capability index (CpK) of the semiconductor package, and possibly leading to failure of the semiconductor device.

Chip-on-Lead (CoL) semiconductor packages are another conventional type of semiconductor package. In CoL packages, the die flag is removed and the die is mounted on extended leads using an adhesive. However, CoL semiconductor packages typically can only be used for larger sized dies because of the well known convention that the distance from the die edge to the lead tip should be no more than 50 micrometers. Also, because conventional CoL packages also include a bonding interface of a high surface area, they also suffer from tensile and residual thermal stresses at the bonding interfaces.

Accordingly, it would be advantageous to provide semiconductor packages that are useful for dies of all sizes and are not subjected to such high tensile and thermal stresses, and thus do not exhibit the defects that result from such stresses.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

DETAILED DESCRIPTION OF THE INVENTION

Figure 1:
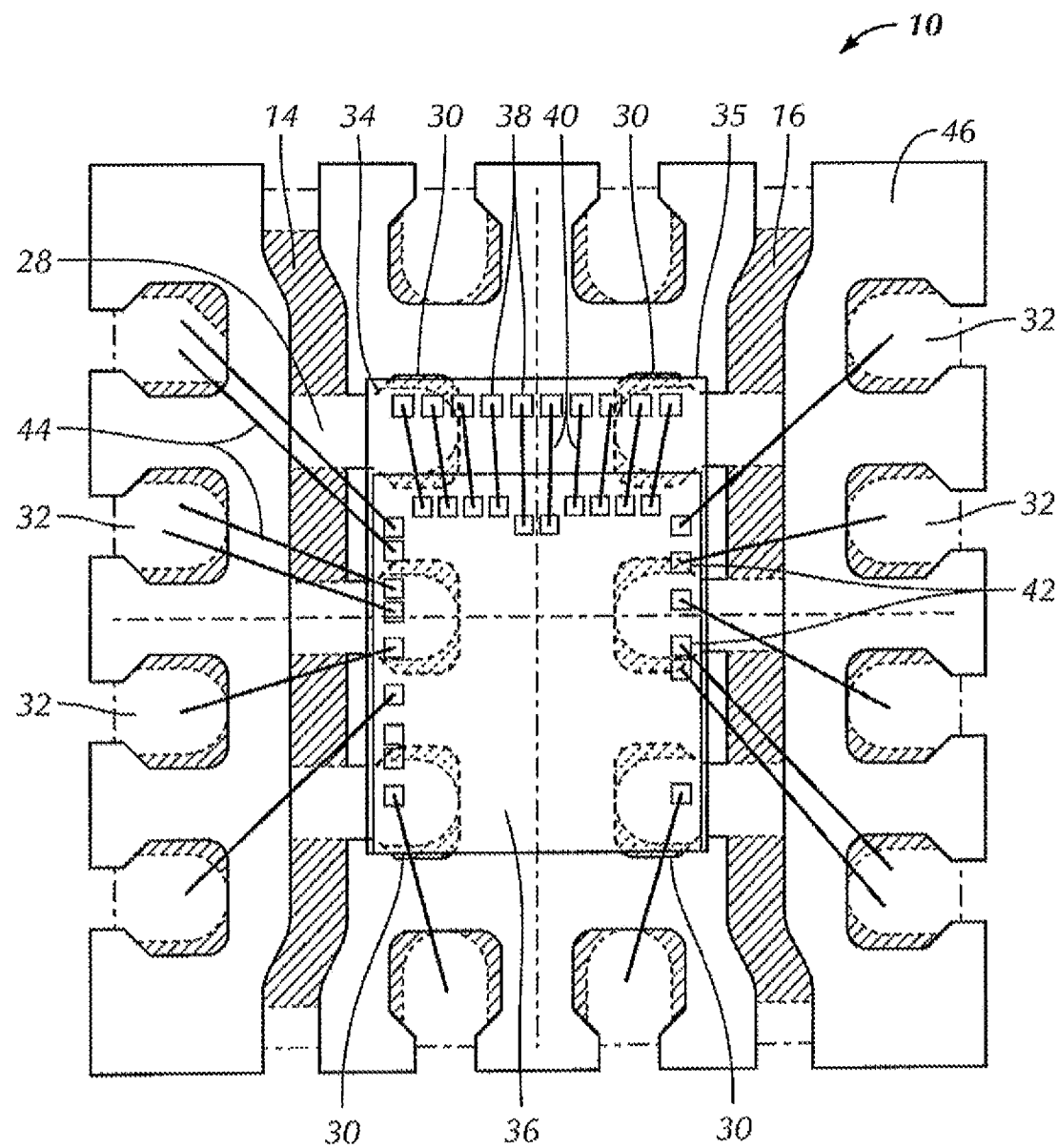
FIG. 1 is a top plan view of a semiconductor package in accordance with an embodiment of the invention, given by way of example.
Figure 2:
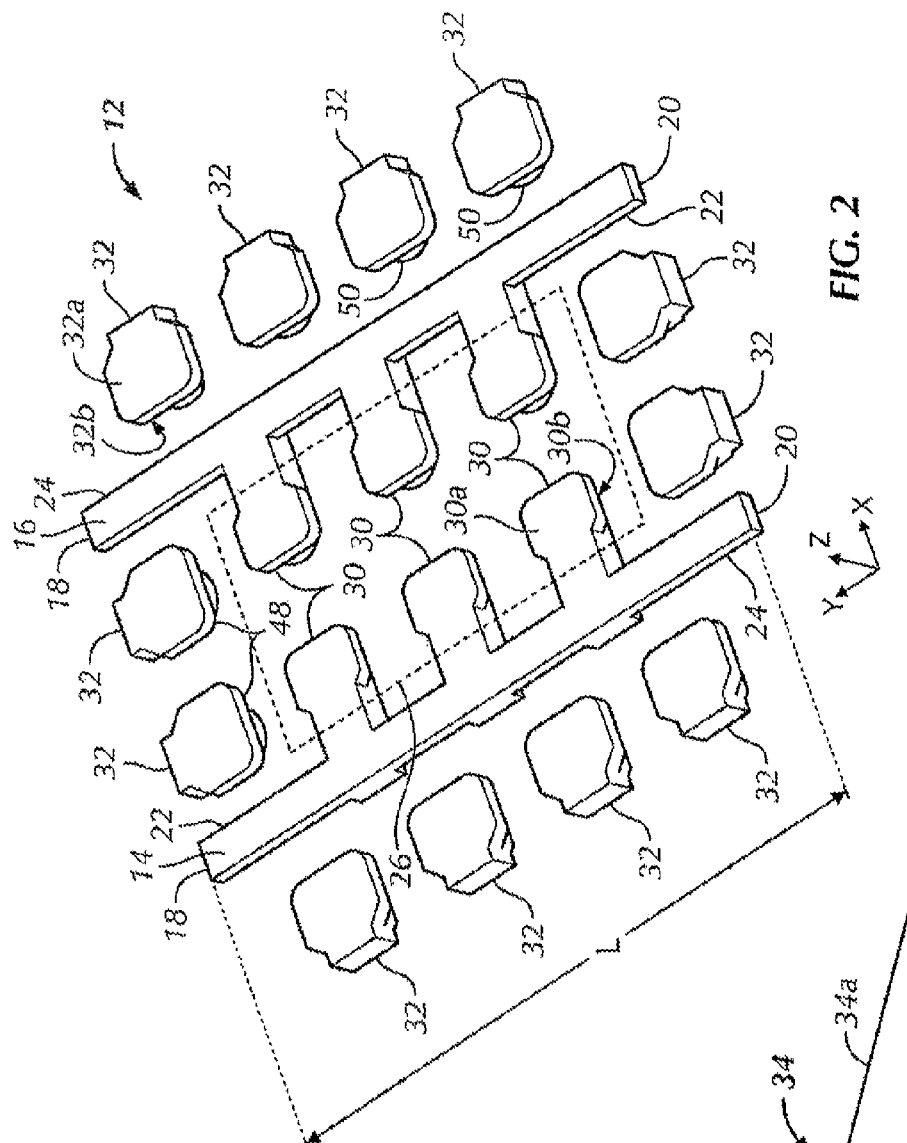
FIG. 2 is a perspective elevational view of a lead frame of the semiconductor package of FIG. 1.

A semiconductor package 10 includes a lead frame 12 as illustrated in FIGS. 1-2. The lead frame 12 may be formed of an electrically conductive material, such as a metal or metal alloy. Preferably, the lead frame 12 is formed of an electrically conductive material that is easy to shape, such as aluminum, aluminum alloys, copper, copper alloys, iron, steel or other like materials. The metal of the lead frame 12 may be bare, unplated, partially plated, or plated with one or more other metals or an alloy such as gold, nickel, iron/nickel alloy, silver, tin, or the like. The lead frame 12 also may be coated with another metal material, such as palladium or any corrosion resistant metal.

Lead frames are well known to those of skill in the art who will understand that the various embodiments of the lead frames of the present invention may comprise a wide variety of materials and may be formed in a wide variety of manners such as cutting, stamping and etching.

The lead frame 12 includes a die flag 50 made up of at least first and second elongated frame members 14 and 16. As shown in FIGS. 1-2, the first and second frame members 14, 16 can generally be mirror images of each other. Thus, for convenience and clarity in the description, and since both frame members 14, 16 include similar features and structures, the same reference numerals are generally used to describe each of the frame members 14, 16.

As shown in FIG. 2, each the first and second frame members 14, 16 can be configured as an elongated bar 14, 16 preferably of a generally rectangular shape. Each frame member 14, 16 has a first end 18, a second opposed end 20, and a length L extending therebetween.

Each frame member 14, 16 also includes a first, internal lateral edge 22 and a second, opposing external lateral edge 24, each of which extends along the length L of the respective frame member 14, 16. More particularly, the first lateral edge 22 of each frame member 14, 16 corresponds to an inner peripheral edge thereof and the second lateral edge 24 corresponds to an opposing outer peripheral edge thereof. Further, the first and second frame members 14, 16 preferably are spaced apart from each other so as to define a die mounting area 26 therebetween. More particularly, the die mounting area 26 is defined between the inner peripheral edges 22 of the first and second frame members 14, 16.

It will be understood that the first and second frame members 14, 16 may alternatively be integrally formed with each other, such as with the use of one or more tie bars connecting the members 14, 16.

A y-axis is defined in a direction of extension of the length L of each frame member 14, 16. A x-axis is defined as a direction perpendicular to the y-axis toward the die mounting area 26. A z-axis is defined as a direction perpendicular to both the x-axis and the y-axis.

The first and second frame members 14, 16 further can include at least one support bar 28. In an exemplary embodiment, shown in FIGS. 1-2, each frame member 14, 16 includes a plurality of support bars 28 of substantially equal length. It should be noted that the number of the support bars 28 in FIGS. 1-2 is for illustrative purposes, and each frame member 14, 16 may have more or fewer support bars that extend therefrom.

The support bars 28 preferably are formed integrally with each frame member 14, 16 of the lead frame 12. Each support bar 28 also preferably extends generally perpendicularly away from the length L of the respective frame members 14, 16 along the x-axis of the package. More particularly, in an exemplary embodiment, each support bar 28 has a generally elongated structure extending inwardly from each frame member 14, 16 toward the die mounting area 26. Accordingly, a first proximal end of each support bar 28 is formed integrally with a respective frame member 14, 16, while a second opposed distal end of the support bar 28 is spaced away from the respective frame member 14, 16 and positioned within the die mounting area 26.

More particularly, the distal end of each support bar 28 is formed as a lead pad 30. It will be understood by those skilled in the art that the support bars 28 may be eliminated and each of the lead pads 30 may be directly connected to and integrally formed with the first and second frame members 14, 16.

Each of the lead pads 30 has a top surface 30a and an opposing bottom surface 30b, and is a chip-on lead pad is configured to receive one or more semiconductor dies, as described more fully herein. In one embodiment, one or more of the chip-on lead pads 30 are also electrically connected to the semiconductor dies.

In the exemplary embodiment, where each frame member 14, 16 includes a plurality of support bars 28, the support bars 28 are preferably spaced apart from each other, such that the lead frame 12 includes a plurality of spaced apart lead pads 30 disposed between the inner peripheral edges 22 of the first and second frame members 14, 16 in the die mounting area 26.

More particularly, in the exemplary embodiment, the lead frame 12 includes a first row of inner lead pads 30 extending along the inner peripheral edge 22 of the first frame member 14 and a second row of inner lead pads 30 extending along the inner peripheral edge 22 of the second frame member 16. In such an exemplary embodiment, the first and second rows of inner lead pads 30 extend parallel to the length L of each frame member 14, 16.

It will be appreciated by those skilled in the art that the inner lead pads 30 may be shaped and sized as necessary to receive a portion of a die and, similarly, the frame members 14, 16 may have alternative shapes and sizes. That is, the shapes and dimensions of the frame members 14, 16 and inner lead pads 30 preferably complement the shape and dimensions of at least a portion of the die to be mounted thereon.

The lead frame 12 further includes at least one external conductive lead 32 proximate at least one of the first and second frame members 14, 16. Preferably, the external conductive leads 32 are spaced apart from each other and/or the first and second frame members 14, 16 at a distance of 250 µm or more. More particularly, at least one external conductive lead 32 is disposed proximate the outer peripheral edge 24 of at least one of the first and second frame members 14, 16. More preferably, at least one external conductive lead 32 is disposed proximate the outer peripheral edge 24 of each of the first and second frame members 14, 16. Each external conductive lead 32 includes a top surface 32a and an opposing bottom surface 32b.

In an exemplary embodiment, as shown in FIGS. 1-2, the lead frame 12 includes a plurality of spaced apart external conductive leads 32 proximate the outer peripheral edge 24 of each of the first and second frame members 14, 16. Each of the external leads 32 is also preferably spaced apart from the outer peripheral edges 24 of the first and second frame members 14, 16 and is located outside of the die mounting area 26. However, in an exemplary embodiment, as shown in FIGS. 1-2, the lead frame 12 may also include one or more external leads 32 positioned between the first and second frame members 14, 16, but outside of the die mounting area 26.

The spaced apart external leads 32 are preferably arranged in rows which extend parallel to the length L of each frame member 14, 16. More particularly, the lead frame 12 includes first and second rows of spaced apart external leads 32 extending adjacent and extending parallel to the second external lateral edge 24 of each frame member 14, 16. As such, each frame member 14, 16 is surrounded by one row of inner chip-on lead pads 30 and an opposing row of external leads 32.

More particularly, in the exemplary embodiment, the lead frame 12 includes a first row of external leads 32 extending along the outer peripheral edge 24 of the first frame member 14 and a second row of external leads 32 extending along the outer peripheral edge 24 of the second frame member 16. In such an exemplary embodiment, the first and second rows of external leads 32 extend parallel to the length L of each frame member 14, 16.

In an exemplary embodiment, illustrated in FIGS. 1-2, the first and second rows of inner lead pads 30 extend parallel to the first and second rows of external leads 32, but are at least slightly offset therefrom. More particularly, for each frame member 14, 16, the position of each inner lead pad 30 is preferably at least slightly offset from the position of each external lead 32. Thus, in the exemplary embodiment, the plurality of spaced apart inner lead pads 30 and the plurality of spaced apart external leads 32 have a staggered orientation relative to one another.

The number and shapes of the external conductive leads 32 may also vary as necessary depending on the type of the semiconductor die, the shape of the semiconductor package 10, and other like factors.

A first IC or semiconductor die 34 is mounted on and attached to one or more of the inner lead pads 30 of the lead frame 12. In the exemplary embodiment, shown in FIG. 1, the semiconductor die 34 is mounted on and attached to all of the inner lead pads 30.

The semiconductor die 34 may comprise any type of functional circuit such as a processor, an accelerometer, control circuit, system on a chip (SoC), memory (e.g., DRAM), application-specific integrated circuit (ASIC), or the like. The present invention also should not be limited by the material or fabrication method of the die itself or technology type of the die, such as whether the die is formed from silicon, gallium arsenide, or another material.

Figure 3:
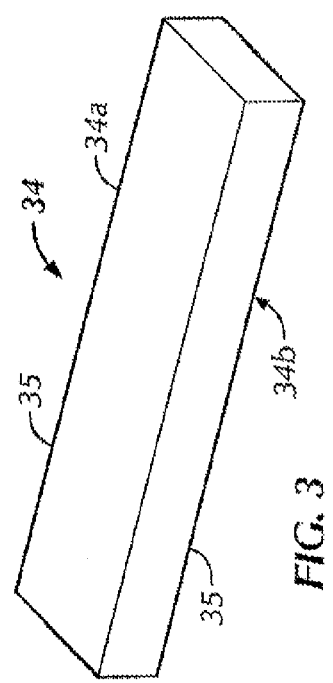
FIG. 3 is a perspective elevational view of a first semiconductor die of the semiconductor package of FIG. 1.

An exemplary first semiconductor die 34 is shown in FIG. 3. The first semiconductor die 34 has a first, top surface 34a, which is an active surface, and a second, opposed bottom surface 34b, which is an inactive surface.

The first semiconductor die 34, and more particularly the bottom surface 34b of the first semiconductor die, may be attached to the inner lead pads 30 using any die attach adhesive known to those of skill in the art and typically used in semiconductor device assembly. The die attach adhesive is dispensed onto the top surface 30a of the each inner lead pad 30 using a known dispensing device. The first semiconductor die 34 is then placed on the die attach adhesive, such that only portions of the bottom surface 34b of the first semiconductor die 34 are in contact with the top surfaces 30a of the inner lead pads 30. The adhesive is preferably subsequently oven cured to allow for the formation of a strong bond between the first die 34 and the inner lead pads 30 of the lead frame 12.

Consequently, in the resulting package structure, the first semiconductor die 34 is supported by and bonded to only minimal portions of the lead frame 12. More particularly, only opposing lateral sides or edges 35 of the bottom surface 34b semiconductor die 34 (i.e., the sides 34a extending in a direction parallel to the length L of each frame member 14, 16 along the y axis) are supported by and in direct contact with the lead frame 12, and more particularly with the inner lead pads 30. Thus, while some portions of the first semiconductor die 34 are attached to an in contact with the inner lead pads 30, other portions of the die 34 are not in contact with the inner lead pads 30.

In one embodiment, the lateral sides 35 of the first semiconductor die 34 may also be in contact with at least a portion of the first and/or second frame members 14, 16.

In an exemplary embodiment, as shown in FIG. 1, a second semiconductor die 36 is mounted on the first semiconductor die 34, and more particularly on the top surface 34a of the first die 34.

At least one bond wire is used to provide an electrical connection between the first semiconductor die 34 and the lead frame 12. Preferably, a plurality of bond wires is provided. In the illustrated embodiment of FIG. 1, a first set of bond wires 40 and a second set of bond wires 44 are utilized to provide an electrical connection between the first semiconductor die 34 and the lead frame 12.

Specifically, in the illustrated embodiment, a first end of each of the first set of bond wires 40 is connected to bond pads 38 of the first semiconductor die 34 and a second end of each bond wire 40 is connected to bond pads 42 of the second semiconductor die 36 to electrically couple the first and second dies 34, 36. Also, a first end of each of the second set of bond wires 44 is connected to the external leads 32 and a second end of each bond wire 44 is connected to bond pads 42 of the second semiconductor die 36 to electrically couple the external leads 32 and the second die 36.

The bond wires 40 and 44 are connected to the die bonding pads 38 and 42 and the external leads 32 using well known wire bonding processes and equipment. The bond wires 40 and 44 are preferably formed from a conductive material such as aluminum, copper, gold, silver, platinum, or similar conductive material, and may be bare or coated with another metal, such as palladium. However, it will be understood that direct connections of the conductive leads 32 to either of the semiconductor dies 34 and 36 are also contemplated.

In the exemplary embodiment, the first semiconductor die 34 is an accelerometer and the second semiconductor die 36 is an ASIC. However, it will also be understood that the semiconductor package 10 may include more or fewer semiconductor dies of various configurations. It will also be understood that various coupling configurations may be utilized. For example, the semiconductor package 10 may include only the first semiconductor die 34 mounted on the inner lead pads 30 and electrically coupled to the external leads 32 with bond wires 40.

A mold compound 46 is used to encapsulate the first and second semiconductor dies 34 and 36, the bond wires 40 and 44, and the lead frame 12. In the resulting structure, the inner chip-on lead pads 30 are electrically isolated from the external leads 32. The mold compound 46 forms a package body and may include plastic or an epoxy mold compound, as is known in the art. The underside of the lead frame 12 may be encapsulated or left exposed for connection to a substrate. The encapsulation process can be done in one or more stages, as is conventionally known.

To facilitate mold locking, at least a portion of the lead frame 12 is preferably half-etched. More particularly, One or more of the inner lead pads 30 preferably includes a half-etching portion 48 on the bottom surface 30b thereof. Also, one or more of the external leads 32 preferably includes a half-etching portion 50 on the bottom surface 32a thereof. The half-etching portions 48 and 50 are areas of removed material of lead frame 12. Thus, each of the top surfaces 30a and 32a of the inner lead pads 30 and external leads 32 has an area that is larger than the area of the respective bottom surfaces 30b and 32b.

The mold compound 46 fills the half-etching portions 48 and 50, thereby facilitating mold locking of the inner lead pads 30 and the external leads 32 so that the inner lead pads 30 and external leads 32 are less likely to become delaminated from the mold compound 46. The staggered configuration of the inner lead pads 30 and external leads 32, relative to each other, also facilitates mold locking of the inner lead pads 30 and the external leads 32.

The structure of the lead frame 12, and more particularly the structure of the first semiconductor die 34 mounted on the lead frame 12, is generally more flexible than rigid. Also, in the semiconductor package 10, the surface area of the contact or bonding interface between the first semiconductor die 34, the die attach adhesive, and the lead frame 12 is minimal. Consequently, tensile and residual thermal stresses at the bonding interface between the first semiconductor die 34, the die attach adhesive, and the lead frame 12 are prevented or at least significantly reduced.

Figure 4:
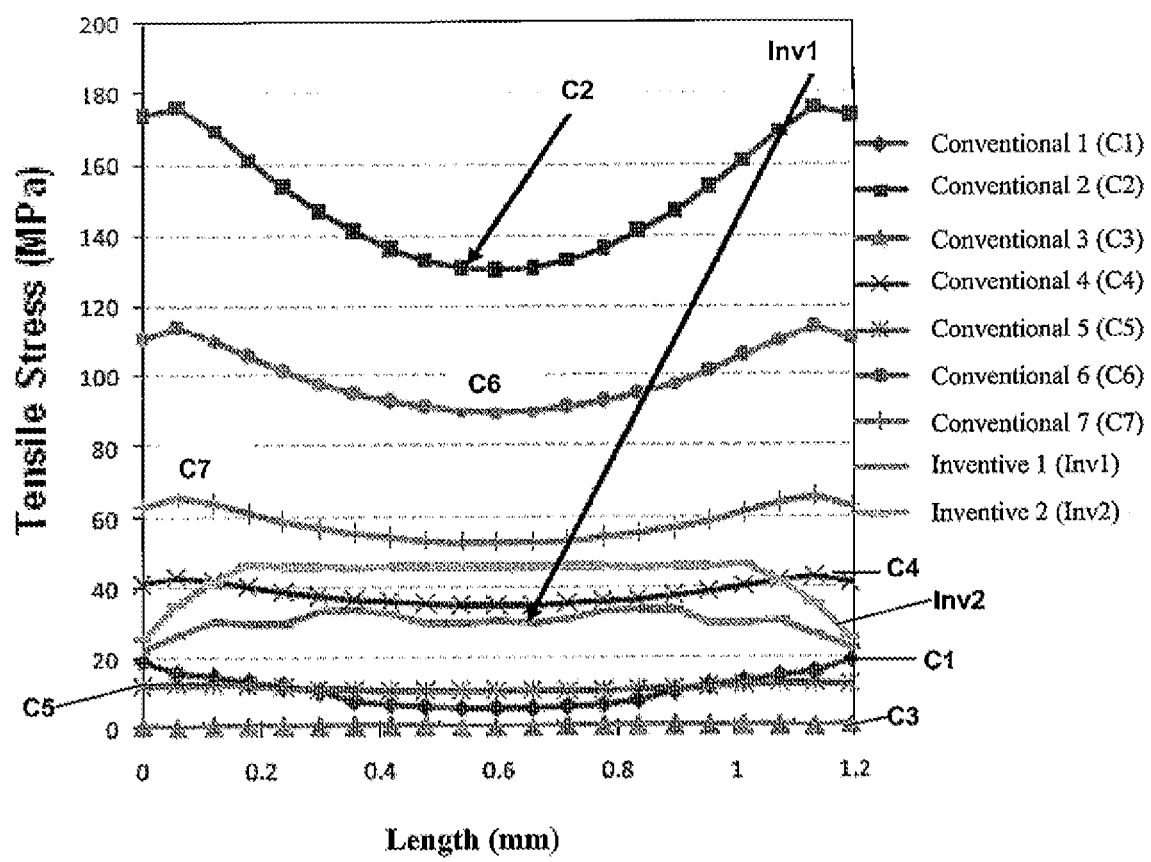
FIG. 4 is a graph of the relationship between tensile stress and size for a semiconductor die of a package structure in accordance with an embodiment of the invention in comparison with that of conventional structures.

FIG. 4 graphically illustrates the stability of the structure of the present invention (specifically a first semiconductor die mounted on the lead frame 12) against tensile stresses during the bonding process, as compared with conventional structures of known QFP and COL packages. For example, the inventive structures (i.e., Inv. 1 and Inv. 2) are clearly superior to conventional QFN packages, such as Conventional Example 2 (C2), in that significantly less tensile stress is exerted on the first semiconductor die 34 of Inv. 1 and Inv. 2 as compared with C2. As a result of this stable configuration and the lack of tensile stresses on the first semiconductor die 34, no cracking occurs in the die 34 during the bonding process.

Figure 5:
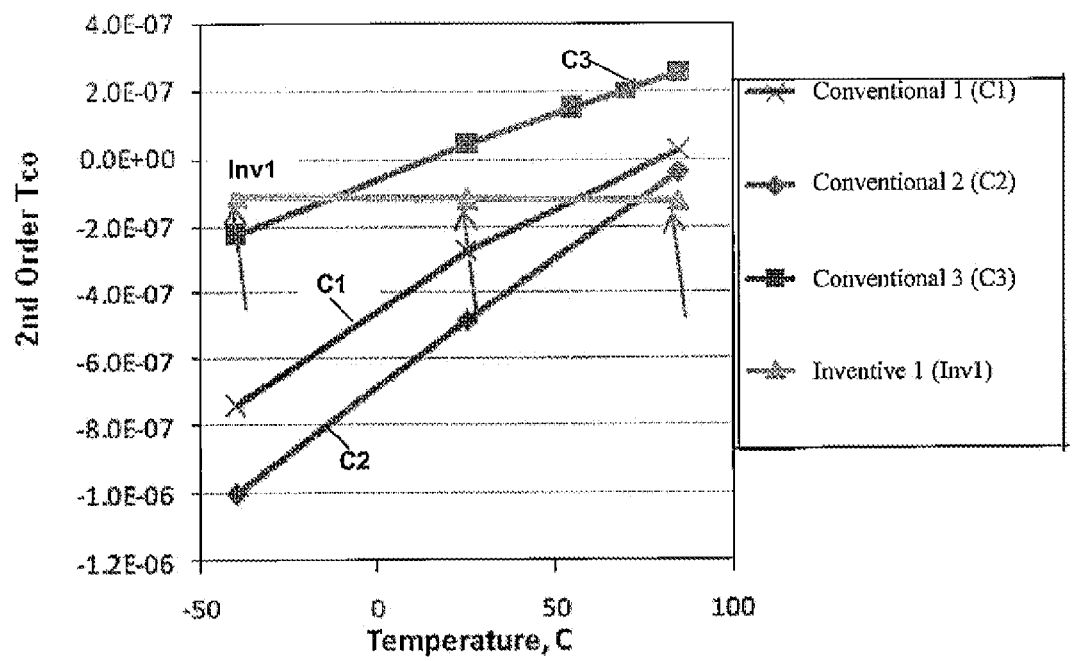
FIG. 5 is a graph of the relationship between the $2^{nd}$ order $T_{co}$ and temperature for a semiconductor die of a package in accordance with an embodiment of the invention in comparison with that of conventional structures.

FIG. 5 graphically illustrates the stability of the structure of the present invention (specifically a first semiconductor die mounted on the lead frame 12) against residual thermal stresses caused by difference in the CTE of the first semiconductor die 34, the die attach adhesive and the lead frame 12. More particularly, FIG. 5 illustrates that the first semiconductor die 34 remains against deformation in the direction of the z-axis in terms of the $2^{nd}$ order $T_{co}$ as a function of temperature in the overall semiconductor package 10, while the $2^{nd}$ order $T_{co}$ of conventional dies increases with increasing temperatures.

Figure 6:
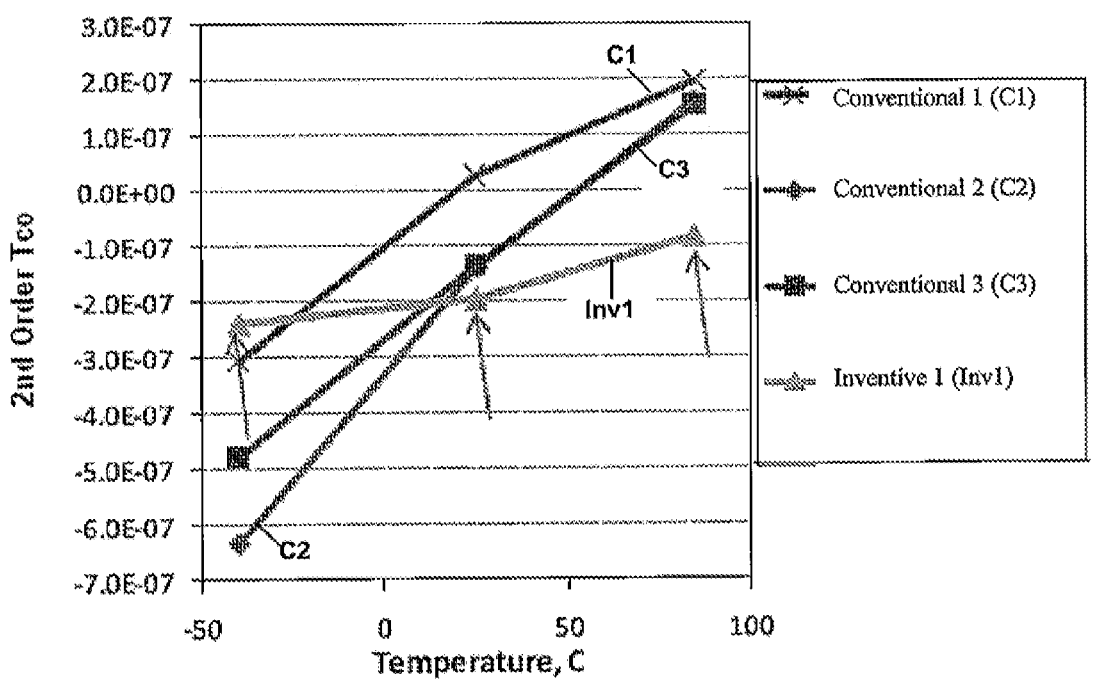
FIG. 6 is a graph of the relationship between the $2^{nd}$ order $T_{co}$ and temperature for a semiconductor die of a package attached to a printed circuit board in accordance with an embodiment of the invention in comparison with that of conventional structures.

FIG. 6 graphically illustrates that the first semiconductor die 34 remains stable against deformation in the direction of the z-axis in terms of the $2^{nd}$ order $T_{co}$ as a function of temperature when overall semiconductor package 10 is attached to a printed circuit board, while the $2^{nd}$ order $T_{co}$ of conventional dies increases with increasing temperatures. In addition, the $T_{co}$ CpK of the semiconductor package 10 is 1.8 or greater, more than three times that of conventional packages.

Figure 7A:
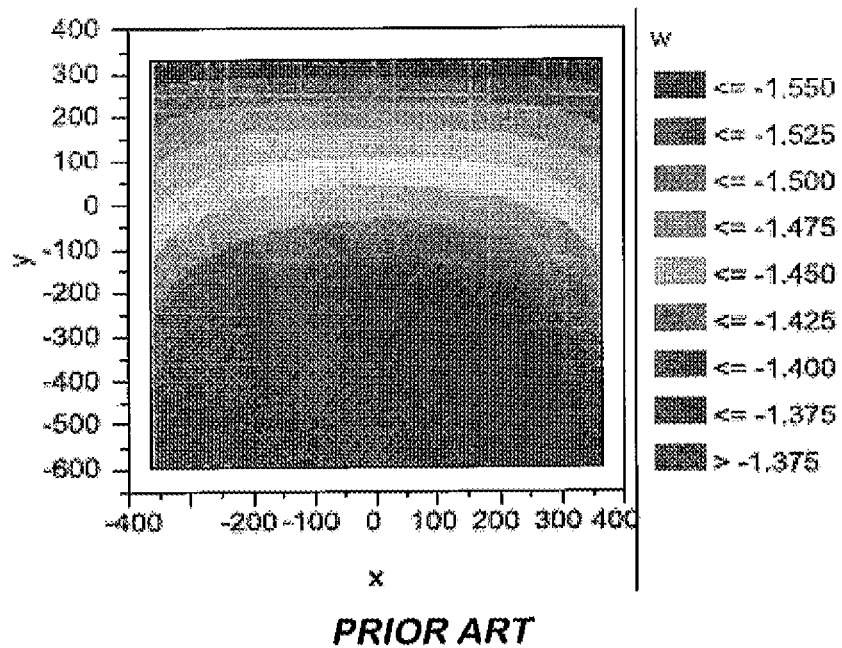
FIG. 7A is a pictorial illustration of the warpage profile of a semiconductor die of a conventional package structure at a temperature of 25° C.
Figure 7B:
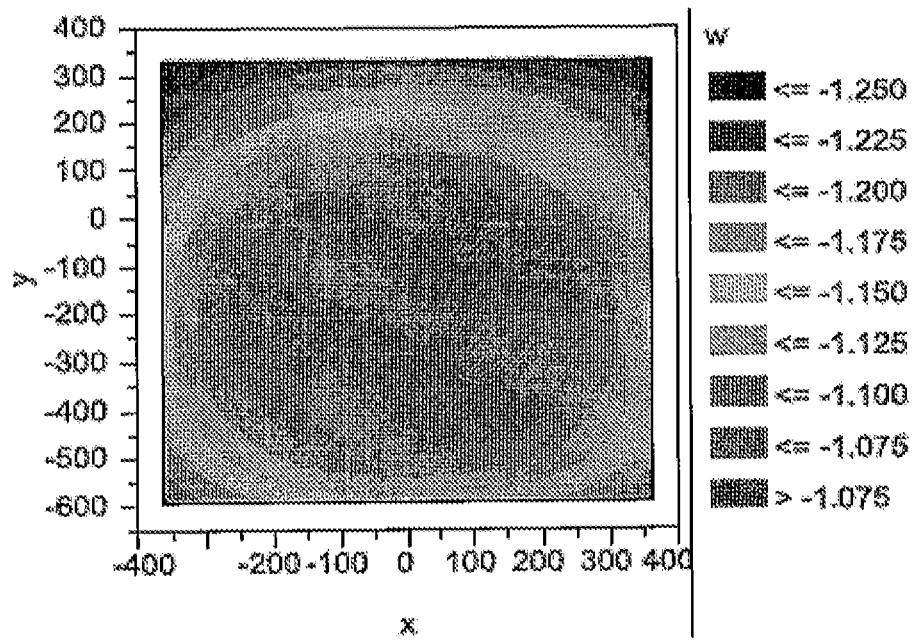
FIG. 7B is a pictorial illustration of the warpage profile of a semiconductor die of a conventional package structure at a temperature of −40° C.
Figure 7C:
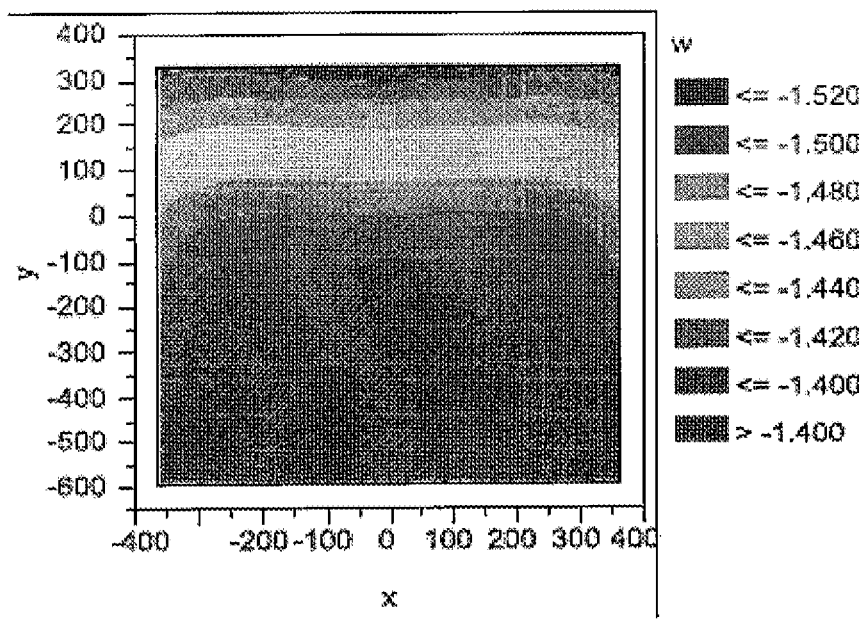
FIG. 7C is a pictorial illustration of the warpage profile of a semiconductor die of a package structure in accordance with an embodiment of the invention at a temperature of 25° C.; and, FIG. 7D is a pictorial illustration of the warpage profile of a semiconductor die of a package structure in accordance with an embodiment of the invention at a temperature of −40° C.
Figure 7D:
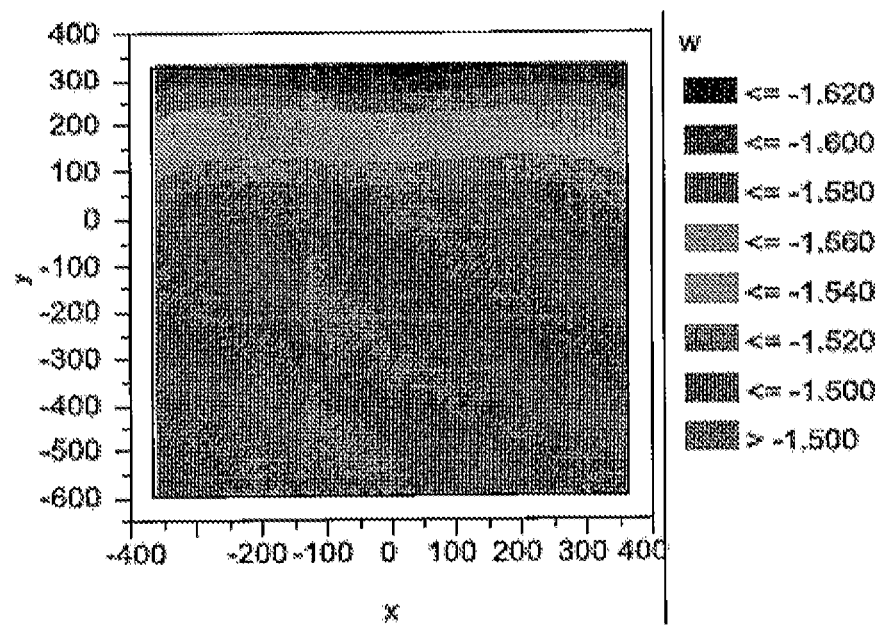

FIGS. 7A-7D pictorially depict the stability of the first semiconductor die 34 against warping as a result of residual thermal stresses at temperatures of 25° C. and −40° C. Specifically, FIGS. 7A and 7B illustrate warping profiles of semiconductor dies in conventional packages, while, for comparison purposes, FIGS. 7C and 7D illustrate warping profiles of the first semiconductor die 34 mounted on the lead frame 12. As can be observed from FIGS. 7A to 7B, semiconductor dies in conventional packages are subject to significant warping even at 25° C., deforming from a tilt shape to a bowl shape. In contrast, as shown in FIGS. 7C to 7D, the profile of the first semiconductor die 34 of the present invention resists deformation or warping.

Also as will be noted by those of skill in the art, the semiconductor package 10 has a hybrid configuration of a QFN package and a CoL package. The lead frame 12 of the present invention is thus particularly suited for use in QFN and CoL packages, as well as a micro-electro-mechanical (MEMS) package.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor material of the dies described herein can be any semiconductor material or combinations of materials, such as gallium arsenide, germanium, silicon germanium, silicon-on-insulator (SOI), silicon, silicon dioxide, monocrystalline silicon, the like, and combinations of the above.

Those skilled in the art will recognize that boundaries between the above-described structures are merely illustrative. The multiple structures may be combined into a single structure, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor package, comprising:
   a lead frame including:
      a first frame member and a second frame member spaced apart from the first frame member, each frame member having an inner peripheral edge and an opposing outer peripheral edge, a plurality of spaced apart lead pads disposed between the inner peripheral edges of the first and second frame members, wherein a first set of the plurality of spaced apart lead pads are arranged in a first row along the inner peripheral edge of the first frame member and a second set of the plurality of spaced apart lead pads are arranged in a second row along the inner peripheral edge of the second frame member, wherein the first and second rows are spaced from each other, and at least one conductive lead disposed proximate the outer peripheral edge of at least one of the first and second frame members;
   a first semiconductor die mounted on at least one of the plurality of lead pads;
   at least one wire providing an electrical connection between the first semiconductor die and the lead frame; and
   a mold compound encapsulating the lead frame, the first semiconductor die and the at least one wire.

2. The semiconductor package of claim 1, wherein a plurality of spaced apart conductive leads is disposed proximate the outer peripheral edges of at least one of the first and second frame members.

3. The semiconductor package of claim 2, wherein a position of each of the plurality of spaced apart lead pads is offset from a position of each of the plurality of spaced apart conductive leads.

4. The semiconductor package of claim 1, wherein the first set of the plurality of spaced apart lead pads are formed integrally with the first frame member and the second set of the plurality of spaced apart lead pads are formed integrally with the second frame member.

5. The semiconductor package of claim 2, wherein the plurality of spaced apart lead pads are electrically isolated from the plurality of spaced apart conductive leads.

6. The semiconductor package of claim 1, further comprising a second semiconductor die mounted on the first semiconductor die.

7. The semiconductor package of claim 1, wherein at least a portion of the lead frame is half etched to facilitate mold locking.

8. The semiconductor package of claim 1, wherein the first semiconductor die is mounted on the plurality of spaced apart lead pads and only a portion of a bottom surface of the first semiconductor die is in contact with the plurality of spaced apart lead pads.

9. The semiconductor package of claim 8, wherein only portions of the bottom surface proximate to opposing lateral edges of the first semiconductor die are in contact with the plurality of spaced apart lead pads.

10. A lead frame for a semiconductor package, comprising:
a first frame member and a second frame member spaced apart from the first frame member, each frame member having an inner peripheral edge and an opposing outer peripheral edge, a mounting area for a semiconductor die being defined between the inner peripheral edges of the first and second frame members;
a plurality of spaced apart lead pads disposed between the inner peripheral edges of the first and second frame members in the mounting area, wherein a first set of the plurality of spaced apart leads pads are arranged in a first row along the inner peripheral edge of the first frame member and a second set of the plurality of spaced apart lead pads are arranged in a second row along the inner peripheral edge of the second frame member, wherein the first and second rows are spaced from each other; and
a plurality of spaced apart conductive leads disposed proximate the outer peripheral edge of at least one of the first and second frame members.

11. The lead frame of claim 10, wherein a position of each of the plurality of spaced apart lead pads is offset from a position of each of the plurality of spaced apart conductive leads.

12. The lead frame of claim 10, wherein the first set of the plurality of spaced apart conductive leads are arranged in a third row along the outer peripheral edge of the first frame member and the second set of the plurality of spaced apart conductive leads are arranged in a fourth row along the outer peripheral edge of the second frame member.

13. The lead frame of claim 10, wherein each of the plurality of spaced apart lead pads is configured to receive a semiconductor die thereon.

14. The lead frame of claim 10, wherein the first set of the plurality of spaced apart lead pads are formed integrally with the first frame member and the second set of the plurality of spaced apart lead pads are formed integrally with the second frame member.

15. The lead frame of claim 10, wherein at least a portion of the lead frame is half etched to facilitate mold locking.

16. The lead frame of claim 15, wherein at least one of the plurality of spaced apart lead pads and at least one of the plurality of conductive leads are half etched to facilitate mold locking.

17. A semiconductor package, comprising:
a lead frame including:
a first frame member and a second frame member spaced apart from the first frame member, each frame member having an inner peripheral edge and an opposing outer peripheral edge,
a first set of spaced apart lead pads integrally formed with the first frame member and being arranged in a first row adjacent the inner peripheral edge of the first frame member,
a second set of spaced apart lead pads integrally formed with the second frame member and being arranged in a second row adjacent the inner peripheral edge of the second frame member, and
a plurality of spaced apart conductive leads disposed along the outer peripheral edges of each of the first and second frame members;
a first semiconductor die having a top surface and a bottom surface, the first semiconductor die being mounted on the plurality of spaced apart lead pads such that a portion of the bottom surface is in contact with the plurality of spaced apart lead pads;
a second semiconductor die mounted on the top surface of the first semiconductor die;
a first set of bond wires each having a first end bonded to the first semiconductor die and a second end bonded to the second semiconductor die, the first set of bond wires providing an electrical connection between the first semiconductor die and the second semiconductor die;
a second set of bond wires each having a first end bonded to one of the plurality of spaced apart conductive leads and a second end bonded to the second semiconductor die, the second set of bond wires providing an electrical connection between the conductive leads and the second semiconductor die; and
a mold compound encapsulating the lead frame, the first and second semiconductor dies, and the first and second sets of bond wires.

18. The semiconductor package of claim 17, wherein another portion of the bottom surface of the first semiconductor die does not contact the plurality of spaced apart lead pads.

* * * * *